United States Patent [19]

Tippner

[11] 4,058,735
[45] Nov. 15, 1977

[54] OPTO-ELECTRONIC CONTACT MECHANISM

[75] Inventor: Franz Tippner, Braunschweig, Germany

[73] Assignee: Siemens Aktiengesellschaft, Berlin & Munich, Germany

[21] Appl. No.: 681,514

[22] Filed: Apr. 29, 1976

[30] Foreign Application Priority Data

June 20, 1975   Germany ............................ 2527520

[51] Int. Cl.$^2$ ............................................. G02B 27/00
[52] U.S. Cl. ...................................... 250/551; 307/311
[58] Field of Search ........................... 250/551, 213 A; 307/311

[56] References Cited

U.S. PATENT DOCUMENTS

| 3,315,176 | 4/1967 | Biard | 250/551 |
| 3,866,051 | 2/1975 | Shearer et al. | 250/551 |
| 3,913,001 | 10/1975 | Kayama | 250/551 |
| 3,975,643 | 8/1976 | Toth | 307/311 |

Primary Examiner—David C. Helms
Attorney, Agent, or Firm—Hill, Gross, Simpson, Van Santen, Steadman, Chiara & Simpson

[57] ABSTRACT

The invention relates to an opto-electronic contact mechanism in which a potential of an input circuit is separated from the potential of an output circuit by two optocouplers. The optocouplers contain an excitor circuit having a radiation transmitter and also a radiation receiver optically coupled to the transmitter, all within a common housing. The mechanism utilizes a pulsed operational mode to distinguish normal operation from erroneous operation.

8 Claims, 2 Drawing Figures

OPTO-ELECTRONIC CONTACT MECHANISM

BACKGROUND OF THE INVENTION

1. Field of the Invention

This invention relates to opto-electronic couplers and more particularly to a circuit arrangement using such couplers between circuits of differing potential.

2. Description of the Prior Art

The family of electronic circuit elements has been enriched within the last few years due to the addition of an electronic relay which is comprised of a light-emitting diode optically coupled to a light-sensitive receiver placed within a housing. These electronic component elements are mentioned in the technical literature as opto-electronic couplers, photocouplers, photo-coupled pairs, optical insulators, or, in short hand form, optocouplers. These otptocouplers are increasingly used in many fields of electrical engineering since they provide an ideal separation for circuits between which a high potential difference exists. Since the optocouplers do not contain any moveable parts or other elements which are subject to wear, a long life will result, even when operated in severe environments. The optocouplers may serve as non-mechanical commutators, switches, and logical switch elements, as well as for connecting data recorders, card punchers, typewriters or other peripheral devices to a computer system without causing undesirable interference in the computer due to such connections.

Optocouplers may basically operated in two modes: in pulse operation or in linear operation. With the first mode of operation, it is possible to drive a luminous diode provided in the excitor circuit of an optocoupler with the use of a pulsed or alternating current. As a result, alternating or pulsing light waves are emitted which impact upon a phototransistor operating as a radiation receiver. Corresponding analogous components are used for a similar circuit operated with direct current in the input circuit. In the case of an optocoupler operated from direct current, however, there is the drawback that a signal potential is provided for operation of the photoreceiver, and, in the case of a defect in the photoreceiver, this signal potential simulates an unwanted logical value which is not related to the associated input signal. For example, when such circuits are used in the field of railroad safety or reactor control for coupling from key or relay contacts, care must be taken that the above-mentioned fault does not cause false signal indications.

SUMMARY OF THE INVENTION

An object of this invention is to use optocouplers in conjunction with a contact mechansim having a magnetizable core, wherein the contact mechanism can process direct-current signals at an input side. It is a further object to provide an optocoupler mechanism having a separation between input and output circuits which does not emit a faulty danger signal in the case of a defect in the mechanism.

The objects of this invention are attained by providing first and second optocouplers whereby the radiation receiver of the first optocoupler, in series with the radiation transmitter of the second optocoupler creates an input circuit for a direct current signal. An output circuit is formed by the radiation receiver of the second optocoupler, and the radiation receiver of the first optocoupler is continuously driven by a pulse generator to produce alternator or pulsed radiation.

Due to the dynamic operation of an opto-electronic circuit mechanism, a signal falsification may occur when certain components fail which corresponds to a logic value. It is therefore essential that the direct current voltage present at the input circuit corresponding to a logical "1" be converted to an alternating signal in the output circuit. Since the alternating voltage will be provided at the output only when an input signal with the value logical "1" is present, the contact mechanism in accordance with the invention is well suited for signal circuits performing safety functions wherein a low signal potential or a direct current voltage signal is assigned to a safe condition.

DESCRIPTION OF THE PREFERRED EMBODIMENTS

Figure 1:
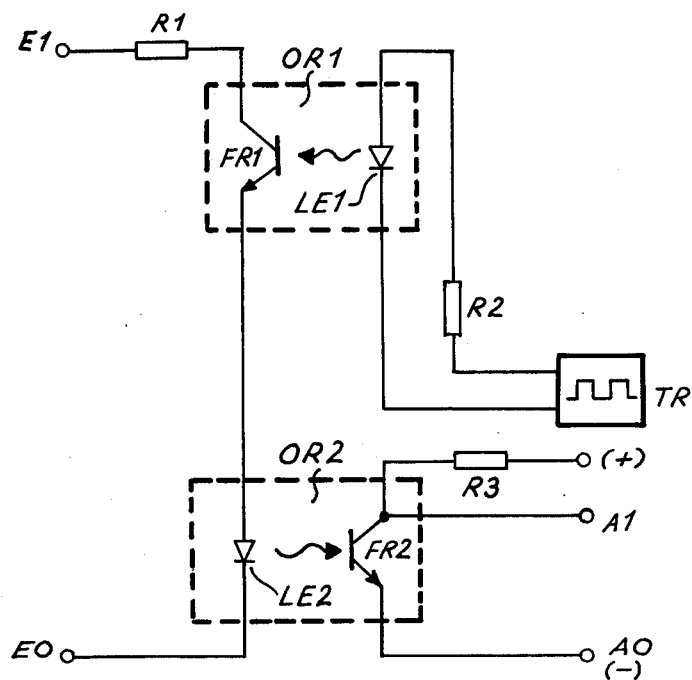
FIG. 1 illustrates the circuit arrangement of an opto-electronic circuit of this invention having two potocouplers.

FIG. 1 shows the circuit diagram of an optoelectronic circuit member having two optocouplers OR1 and OR2 which contain a luminescent diode LE1 or LE2, respectively, as well as a phototransistor FR1 or FR2 optically coupled respectively thereto. An input circuit of the opto-electronic circuit member is formed of the series connection of the phototransistor FR1 of the first potocoupler OR1 in series with the luminescent diode LE2 of the second optocoupler OR2. In order to limit current flow, a resistance R1 is connected in series with the phototransistor FR1. The input terminals are denoted by E0 and E1. The luminescent diode LE1 of the first optocoupler OR1 is continuously driven by rectangular pulses from a timing generator TR via a resistance R2 in order to produce alternating or pulsating light waves. The phototransistor FR2 of the second optocoupler serves as the output circuit and has its collector electrode connected with the positive terminal of a DC power supply via a resistance R3. The emitter electrode of the phototransistor FR2 is connected to the minus terminal. The output of the circuit member is referenced A0 and A1.

As long as no direct-current signal is given at the terminals E0 and E1, the luminescent diode LE2 will not emit any radiation to the associated phototransistor FR2, although the phototransistor FR1 is receiving alternate light waves from the luminescent diode LE1. This results since the phototransistor FR2 is blocked and the terminal A1 carries a high continuous positive potential. When a high direct-current signal associated with a logic state "1" is present at the terminals E0 and E1, the luminescent diode LE2 is periodically supplied with current due to the alternately controlled phototransistor FR1, and emits alternate radiation to the phototransistor FR2, such as in the infrared range. Such radiation controls the phototransistor FR2 conduction and a signal alternating between high and low values is created at the ouput A1. Since this alternate signal corresponds to the direct-current signal having a logical value "1" present at input circuit E0, E1, a component failure such as a disruptive discharge of the phototransistors FR1 or FR2, cannot cause an erroneous signal since the described alternate output signal would become a direct-current signal.

Figure 2:
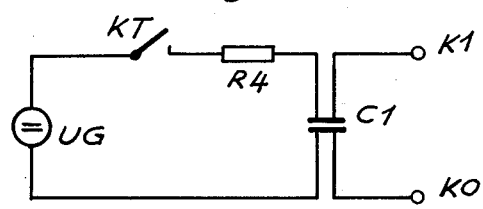
FIG. 2 illustrates a circuit arrangement for a contact mechansim position indicating circuit.

FIG. 2 shows a circuit arrangement which provides a data input such as a logic signal at terminals E1 and E0 of the above described opto-electronic contact mechanism. A direct-voltage source UG is provided which may be connected to a switch KT, the position of which is to be monitored. A capacitor C1 is provided across terminals K0 and K1 and a resistance R4 connects between CI and the switch KT. Terminals K1 and K0 respectively connect with E1 and E0 of the circuit arrangement in accordance with FIG. 1. The integration member C1/R4 provides a constant direct current signal, in spite of possible sputtering of the input contact or switch KT at terminals K0 and K1. Thus multiple signals of logical value "1" are prevented.

It is furthermore particularly advantageous to use a capacitor C1 which, due to safety and technical reasons, has four contacts instead of two for permitting control with respect to a line brake as known in the prior art.

Since the current flowing via the closed input contact KT must flow through the input leads of the capacitor C1 to control the opto-electronic contact mechanism in accordance with FIG. 1, an interruption in the terminal leads of capacitor C1 will prevent the further transmission of alternating light waves to phototransistor FR2.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An opto-electronic contact mechanism for coupling between an input and an ouput having different operating potentials comprising:
    a. first and second optocoupler means each having a radiation transmitter and a radiation receiver;
    b. an input circuit for a direct current electrical signal comprised of the radiation receiver of the first optocoupler connected in series with the radiation transmitter of the second optocoupler;
    c. an output circuit comprised of the radiation receiver of the second optocoupler; and
    d. a timing generator connected to the radiation transmitter of the first optocoupler for producing a time-varying radiation from said optocoupler radiation transmitter.

2. The mechanism of claim 1 in which an output of an integration means comprising a capacitor and resistor is connected to the input circuit, an input contact and an associated direct current voltage source being connected to an input of said integration means.

3. The mechanism of claim 2 in which said capacitor has two contacts per electrode.

4. The mechanism of claim 1 in which the radiation transmitter of said first optocoupler comprises a light emitting diode in series with a current limiting resistor driven by said timing generator.

5. The mechanism of claim 1 in which the radiation receiver of said second optocoupler comprises a power source having a load resistor and phototransistor connected in series thereto.

6. The mechanism of claim 1 in which the radiation receiver of said first optocoupler comprises a current limiting resistor in series with a phototransistor.

7. An opto-electronic coupling mechanism for prevention of false signal indications comprising:
    a. first and second couplers each comprising a radiation transmitter and receiver;
    b. electrical data signal input terminals having the first coupler transmitter and second coupler receiver connected in series thereacross, said data signal providing a supply potential for said first coupler transmitter and second coupler receiver.
    c. ouput terminals connected to said second coupler receiver; and
    d. a signal generator connected to said first coupler transmitter.

8. The mechanism of claim 7 in which a data signal circuit is connected to said data signal input terminals, said circuit comprising:

* * * * *

Disclaimer 4,058,735.—*Franz Tippner*, Braunschweig, Germany OPTO-ELECTRONIC CONTACT MECHANISM. Patent dated Nov. 15, 1977. Disclaimer filed Dec. 21, 1981, by the assignee, *Siemens Aktiengesellschaft.*

Hereby enters this disclaimer to all claims of said patent.
[*Official Gazette March 23, 1982.*]